(12) United States Patent
Lindenmeier et al.

(10) Patent No.: US 6,421,532 B1
(45) Date of Patent: Jul. 16, 2002

(54) RECEIVER SYSTEM FOR VEHICLES

(75) Inventors: Heinz Lindenmeier, Planegg; Jochen Hopf, Haar; Leopold Reiter, Gilching, all of (DE)

(73) Assignee: FUBA Automotive GmbH & Co. KG, Bad Salzdetfurth (DE)

( * ) Notice: Subject to any disclaimer, the term of this patent is extended or adjusted under 35 U.S.C. 154(b) by 0 days.

(21) Appl. No.: 09/418,616

(22) Filed: Oct. 15, 1999

(30) Foreign Application Priority Data

Oct. 15, 1998 (DE) .......................................... 198 47 653

(51) Int. Cl.$^7$ ................................................. H04B 1/10

(52) U.S. Cl. ........................... 455/99; 455/296; 375/285

(58) Field of Search ................................ 455/296, 297, 455/311, 312; 375/285, 346

(56) References Cited

U.S. PATENT DOCUMENTS

| | | | | |
|---|---|---|---|---|
| 4,403,305 A | * | 9/1983 | Imai | 455/297 |
| 4,584,714 A | * | 4/1986 | Fukuhara | 455/297 |
| 5,204,973 A | * | 4/1993 | Sugayama | 455/212 |

FOREIGN PATENT DOCUMENTS

DE                24 60 227          12/1978

* cited by examiner

*Primary Examiner*—Lee Nguyen
*Assistant Examiner*—Danh C Lee
(74) *Attorney, Agent, or Firm*—Collard & Roe, P. CV.

(57) ABSTRACT

The invention relates to a receiver system for vehicles having an antenna and a receiver with an interference signal receiving device. This interference receiving device comprises a coupling element with an input for taking up the pulse-like interference radiation emitted by the vehicle aggregates and which interference radiation emitted by the vehicle aggregates and which interfere with the reception, with an evaluation circuit for presenting the interference radiation. A controllable transmission element is disposed within the receiver between transmission elements. Controllable transmission element is controllable with respect to its transmission behavior for the purpose of signal sampling, which also receives output signals of evaluation circuit so that during the duration of the interference pulses, the interference pulses interfered with receive and sample usable signals. The coupling element is configured and positioned within the vehicle so that its output signal contains the pulses of the interference radiation which lead to the reception interference, and the component of the receiving usable signals is considerably low.

22 Claims, 8 Drawing Sheets

RECEIVER SYSTEM FOR VEHICLES

BACKGROUND OF THE INVENTION

1. Field of the Invention

The invention relates to a receiver system for vehicles having a circuit for suppressing the receipt of an interference radiation emitted by these vehicles.

2. Description of the Prior Art

The interference radiation emitted by the vehicle body often leads to a considerable lowering of the quality of the receipt in the on board receiver system. Particularly in the range of the receipt of the middle and short wave (AM range) radio waves, the radio receipt is often strongly affected by audible pulse-like interferences.

Often the ignition system and digital components create a series of high intensity high frequency component radio waves that are received via an antenna and sent into a receiver. These radio waves are of such intensity that the antenna cannot be attached in the vicinity of the engine, or respectively any means causing strong interference radiation is not possible. In the praxis of automobile construction, by arranging the conduits or the input of means avoiding interference, it has been shown that the suppression of an interference emitting radiation through these measures is often not feasible or only feasible with high cost.

Thus, antenna systems for vehicles with front wheel engines are now disposed in the rear region. This is done to attain an improved interference distance with the aid of the larger distance from the main interference source. However, vehicle interferences are often so intensive that even in the case of antennas that are arranged away from the interference source, there is still noticeable interference.

In German Patent 24 60 227.5 there is shown a proposed solution to present vehicle interference with respect to the amount of phase in the HF range with the aid of control system and in superposition to the receiver signal of the receiver system. This receiver system is affected by the interference in that manner that the interference components in the receiver signal are cancelled. This method is very cost intensive and relies on the precise evaluation of the interference effective in the receiver antenna which is in many cases impossible.

SUMMARY OF THE INVENTION

Therefore, one object of the invention is to provide an effective and cost efficient arrangement so as to reduce the interference to render inaudible the receiver interferences which are associated with the interference radiation emitted by the entire vehicle, particularly in the frequency bands of amplitude modulated radio.

This aim is solved in accordance with the invention in a receiver system for vehicles. With the present invention, there is an advantage in that the determination of the time intervals, within which a series of received usable signals must be sampled. In this way, the interference from an interference radiation is not passed through the terminus device and is not determined in the received usable signals. The essence of the invention resides in that with the aid of one or more coupling elements, the interference radiation is taken up separately, and the signal corresponding to the received usable signals is rather small.

Thus from this invention it is possible to configure the shortest possible sampling time through the sampling of the received usable signals so that the interference is as small as possible. In the praxis it shows that there is often appreciable interference so that even with a strong received usable signal and a weak interference signal, interference free reception is rare. This applies particularly in periods when there is electrical ignition or when there are pulses of digital signals and especially in the AM radio range. Accordingly the invention is aimed to determine the time intervals of the appearance of pulse-like interferences, separated from the received usable signals, and to determine the sampling time points and the duration of sampling in accordance with the invention.

This is done with the aid of an interference signal receiving device. In addition there is also a coupling element for the uptake of the pulse-like interfering interference radiation emitted by the entire vehicle. Thus, the coupling element is positioned in the vehicle in such a manner and configured in such a way that its output signal predominantly contains the pulses leading to receiving interference of the interference radiation, wherein a component of the received usable signals is low so that the ratio of the component of the receiving usable signals over the interference beam is at least 10 dB lower than the output of the antenna over the interference beam.

BRIEF DESCRIPTION OF THE DRAWINGS

Other objects and features of the present invention will become apparent from the following detailed description considered in connection with the accompanying drawings which disclose several embodiments of the present invention. It should be understood, however, that the drawings are designed for the purpose of illustration only and not as a definition of the limits of the invention.

In the drawings wherein similar reference characters denote similar elements throughout the several views.

DETAILED DESCRIPTION OF THE PREFERRED EMBODIMENT

Figure 1:
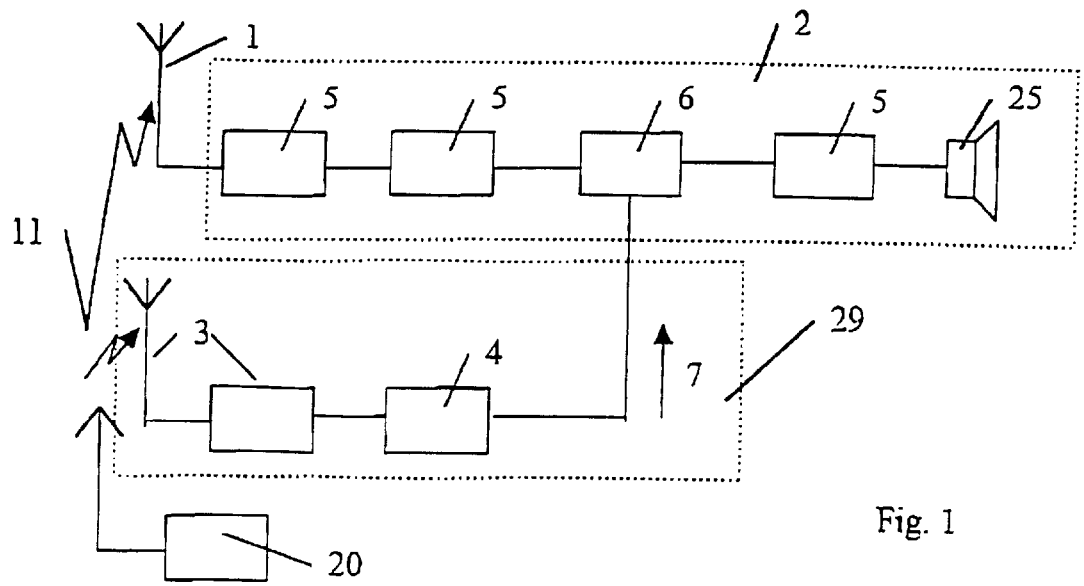
FIG. 1. shows a block diagram of the first embodiment of the receiver system.

FIG. 1 refers to a receiver system having a receiver 2 connected to antenna 1, and connected to an interference signal receiving device 29. Receiving device 29 comprises a coupling element 3 and an evaluation circuit 4. Evaluation circuit 4 is for the generation of a sample signal 7 when the receiver system receives an interference signal 11 from vehicle 20.

In a first, simplified embodiment, a controllable transmission element 6 is contained in a interference signal receiving device 29. Interface signal receiving device 29 also contains transmission elements 5 connected to and disposed adjacent to controllable transmission element 6. In this case, when sample signal 7 is introduced into transmission element 6, it blocks transmission of interference radiation 11 from passing on to terminus device 25. This sampling can be carried out as full sampling over a fixedly adjusted time interval. In this case, there is a congruent time interval between the occurrence of the interference in a series of received usable signals 16, and sample signals 7.

When the sampling time is longer than the occurrence of the interference in the received usable signal 16, there is unnecessarily large and unavoidable interference. However, when the sampling time is smaller than the occurrence of interference in the received usable signal 16, the interference in the receiving usable signal is not fully ineffective. To overcome this discontinuity in time intervals, the receiver can be configured to reduce interference by means of sampling techniques such as soft sampling with time wise polished transitions, having appropriate sampling depth which is limited taking back of the transmission characteristics in controllable transmission element 6. In addition other techniques such as sample and hold techniques whereby the momentary value of the received usable signal 16 during the sampling time is held at the last value.

Figure 1B:
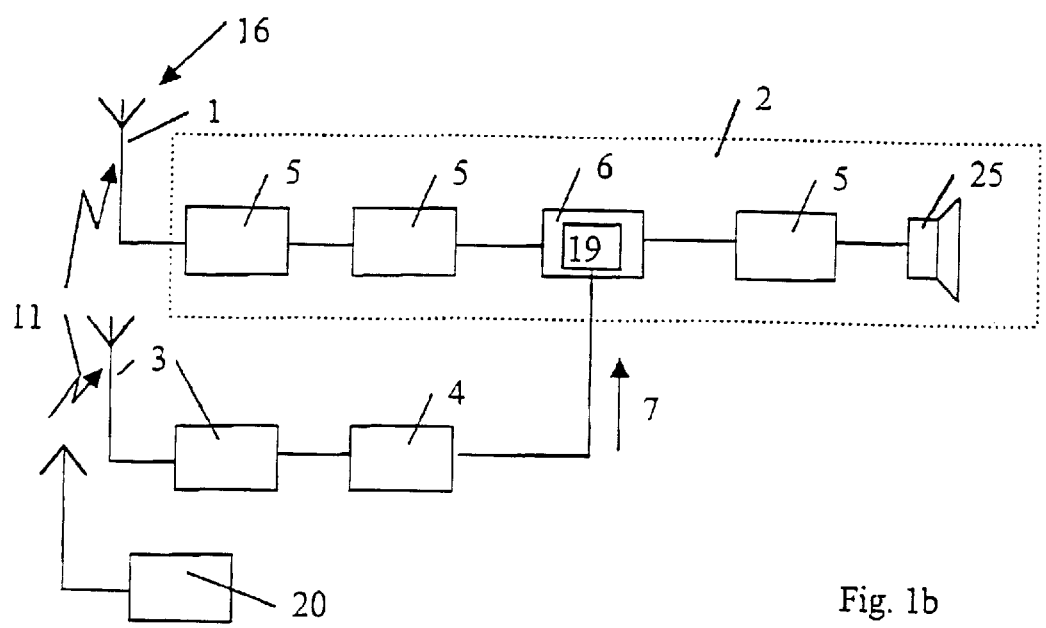
FIG. 1b shows a block diagram of an additional embodiment of the invention further comprising sampling device.

FIG 1b shows a second embodiment of the receiving system wherein the interference signal receiving device 29 is integrated in a housing with receiver 2, with separated input connections for antenna 1 and coupling element 3. In addition in this embodiment there is shown sampling device 19 disposed within controllable transmission element 6. Sampling device 19 is for receiving sample signals 7 from evaluation circuit 4.

Figure 2:
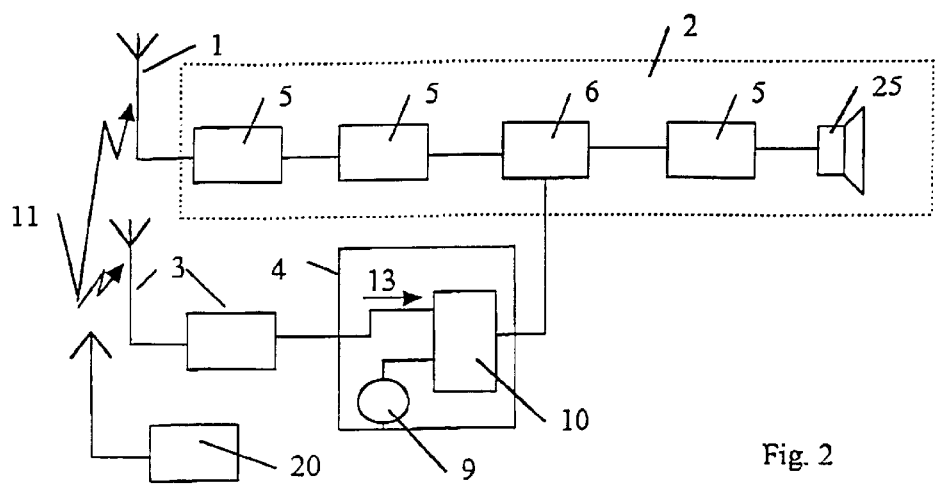
FIG. 2 shows a block diagram of another embodiment of the invention wherein the evaluation circuit further comprises a reference level and a logic circuit.

As shown in FIG. 2, interference radiation 11 is received via coupling element 3 and i s evaluated in a broad band manner. To start the sampling process in evaluation circuit 4, there is a comparing logic circuit 10 with two inputs disposed with in evaluation circuit 4. The first input is connected to the interference radiation level 13, which is compared with reference level 9 at the other input. When reference level 9 is exceeded by interference radiation level 13 at the exit of logic circuit 10, sample signal 7 is generated which effects the sampling process in controllable transmission element 6.

Figure 3A:
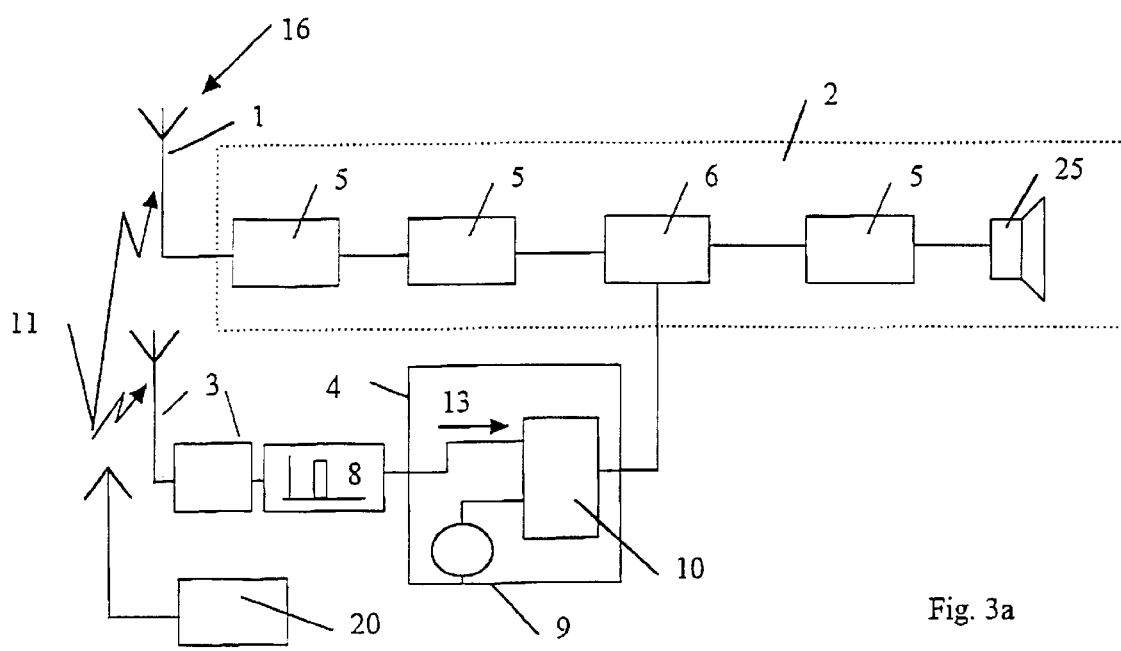
FIG. 3a shows a block diagram of another embodiment of the invention wherein the evaluation circuit comprises a bandpass filter.
Figure 3B:
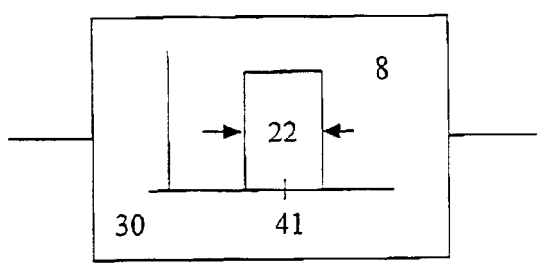
FIG. 3b is a block diagram of the band pass filter having a low frequency component and a band width having a middle frequency.

When there are time wise pulse forms which have only relatively low signal components in the frequency range of receiver 2, the sampling interval is often too long and not optimally placed time wise. Because the invention offers a substantial improvement the frequency band width is narrowed in interference radiation signal receiving device 29. This result is obvious from FIGS. 3a and 3b. In this design, there is a band pass filter 8, that is post connected to coupling element 3. Band pass filter 8 is adjusted, with its middle frequency 41, wherein its band width 22 is selected to be sufficiently large so that the indicated interference radiation level 13 is largely representative of the interference arising in the receipt channel of receiver 2. A further possibility exists therein to configure the band width 22 of band pass filter 8 nearly congruently with that frequency range wherein receiver 2 can be adjusted.

Figure 4:
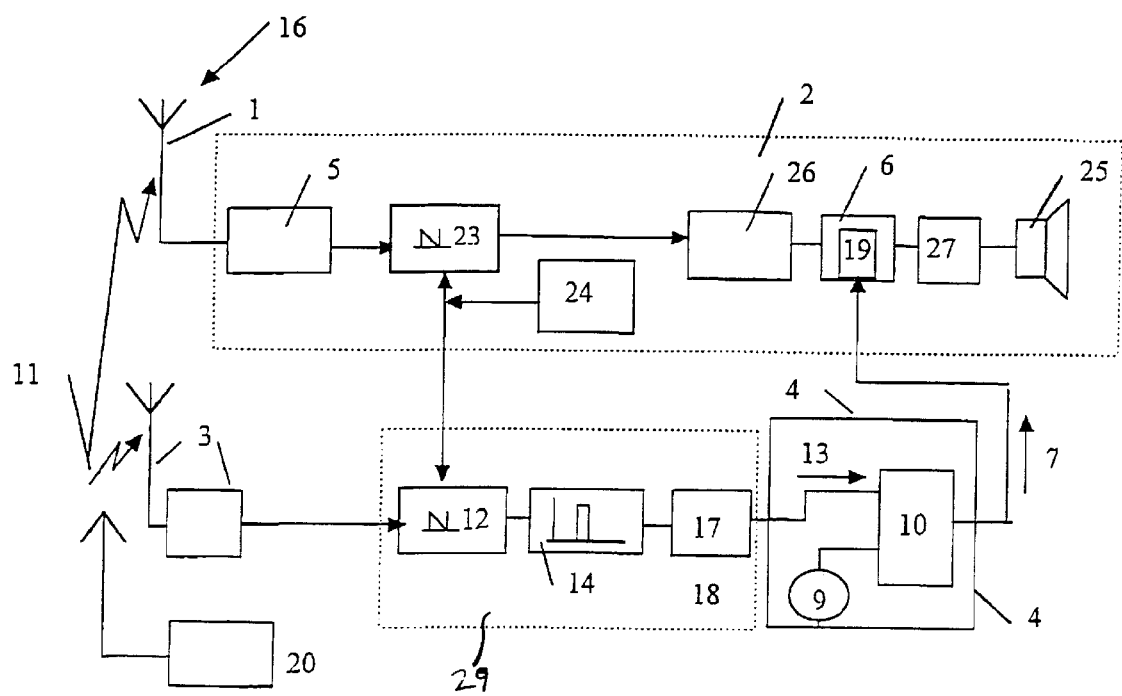
FIG. 4 shows a block diagram of an additional embodiment of the invention further comprising a receiver circuit.

As shown in FIG. 4, the signal band width in interference signal receiving device 29 is adapted to the channel band width of receiver 2. This will ensure that sample signal 7 is present only due to those components in interference radiation 11 which can lead also to interferences in the receiver, and thereby, in terminus device 25. Thus, the sampling time is limited to the lowest extent required. Oscillator 24 of receiver 2 is used with the superposition principle to ensure the adjustment of the interface signal receiving device to the present receipt channel of receiver 2. As shown in FIG. 4, controllable transmission element 6 contains sampling device 19 which is disposed adjacent to receiver ZF component 26 but ahead of receiver demodulator 27. Interference radiation 11 is read by coupling element 3 which then presents signals that are converted in interference signal mixer 12 to the intermediary frequency plane and limited in their band width with the aid of an intermediary frequency filter 14. With the aid of a demodulator circuit 17, the interference radiation level 13 is won and passed to logic circuit 10 and next processed.

Now controllable transmission element 6 is disposed behind receiver ZF component 26 in the sequence of the transmission elements 5. Thus, the one advantage of the receiver system is that because of band limitations in the receiver 2 and the arising delays are similar in the interference signal receiving device 29, only small differences in transit time arise. Thus, the sampling intervals of the signals arise approximately nearly fully time wise with the pulse-like interferences in the receiving usable signal 16.

Figure 5:
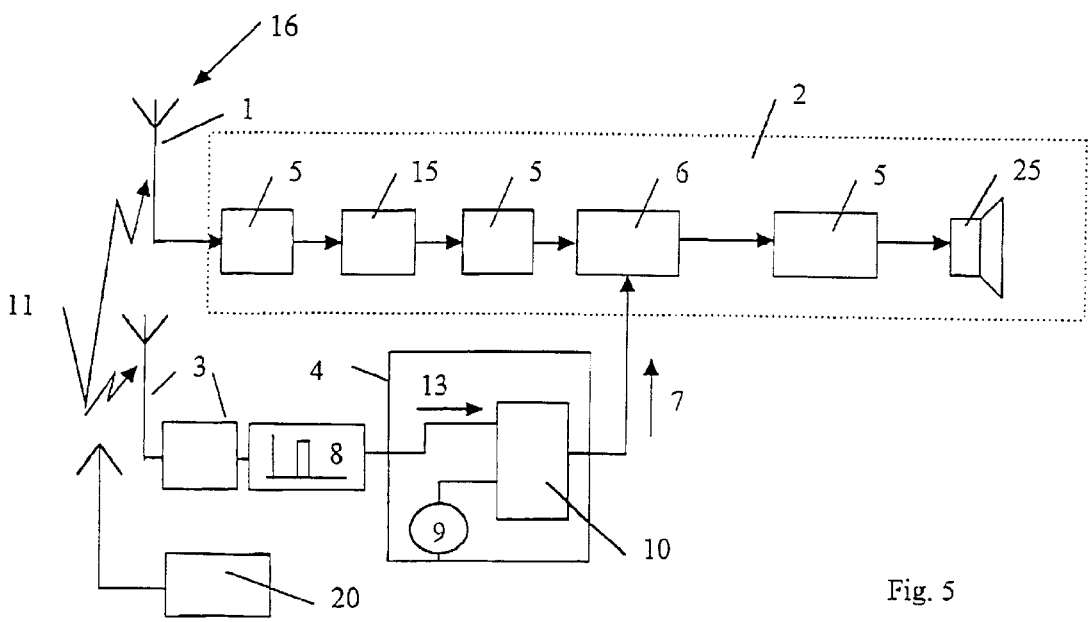
FIG. 5 shows a block diagram of another embodiment of the invention wherein the evaluation circuit comprises a logic circuit.

In another embodiment of the invention, as shown in FIG. 5, the invention requires that the logical signal experiences retardation at the exit of logic circuit 10 due to band limitation. This occurs through inclusion of a transit time element 15 in sequence with transmission elements 5 in receiver 2 which is adjusted prior to controllable transmission element 6. This type receiver is shown in FIG. 5. Thus, the time wise placement of the sampling interval is largely congruent with the point of time of the appearance of the interference in the receiving usable signal 16.

Figure 6:
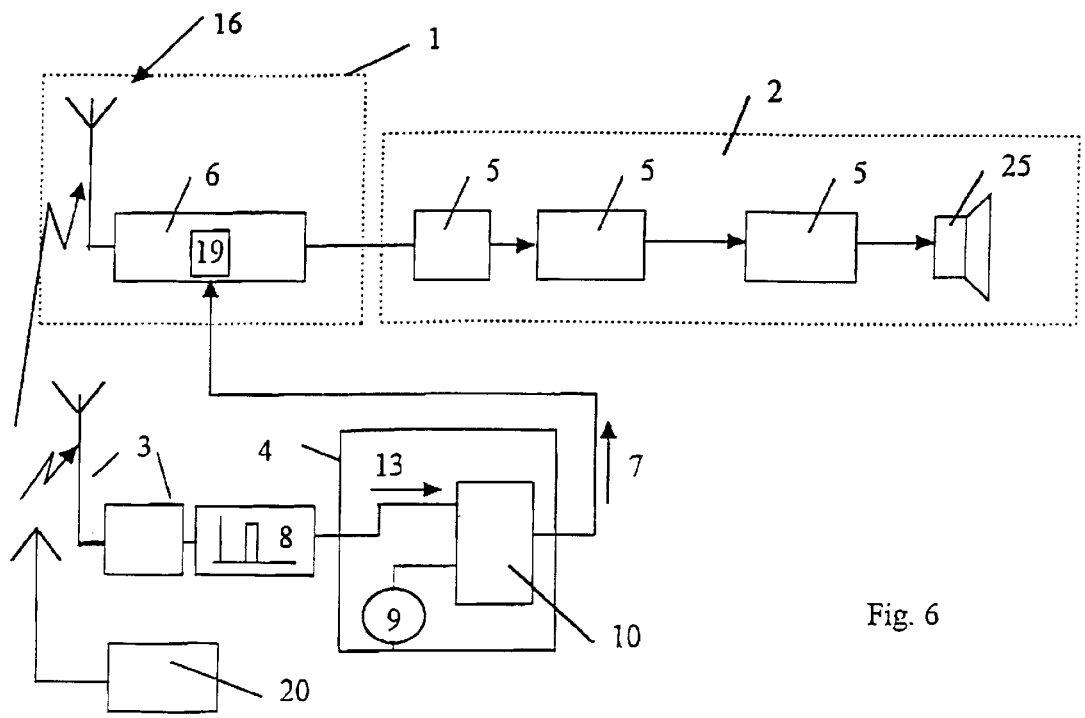
FIG. 6 shows a block diagram of another embodiment of the invention wherein the antenna is configured as a controllable transmission element having a sampling device.

It is common in the automotive industry for receiver devices to be included within the production of the auto. Unfortunately, in many cases, because of requirements, different vehicle series may not permit the integration of an interference signal receiving device 29. For these cases, it is possible in another embodiment of the invention to configure the interference signal receiving device 29 by utilizing serially manufactured receivers 2. A receiver system of this type is shown in FIG. 6. In this embodiment, antenna 1 is configured as controllable transmission element 6, which contains sampling device 19 which receives sample signal 7. The interference signal receiving device 29 can thereby be arranged in the vicinity of antenna 1 in the vehicle, or respectively can form a component unit with antenna 1.

Figure 7:
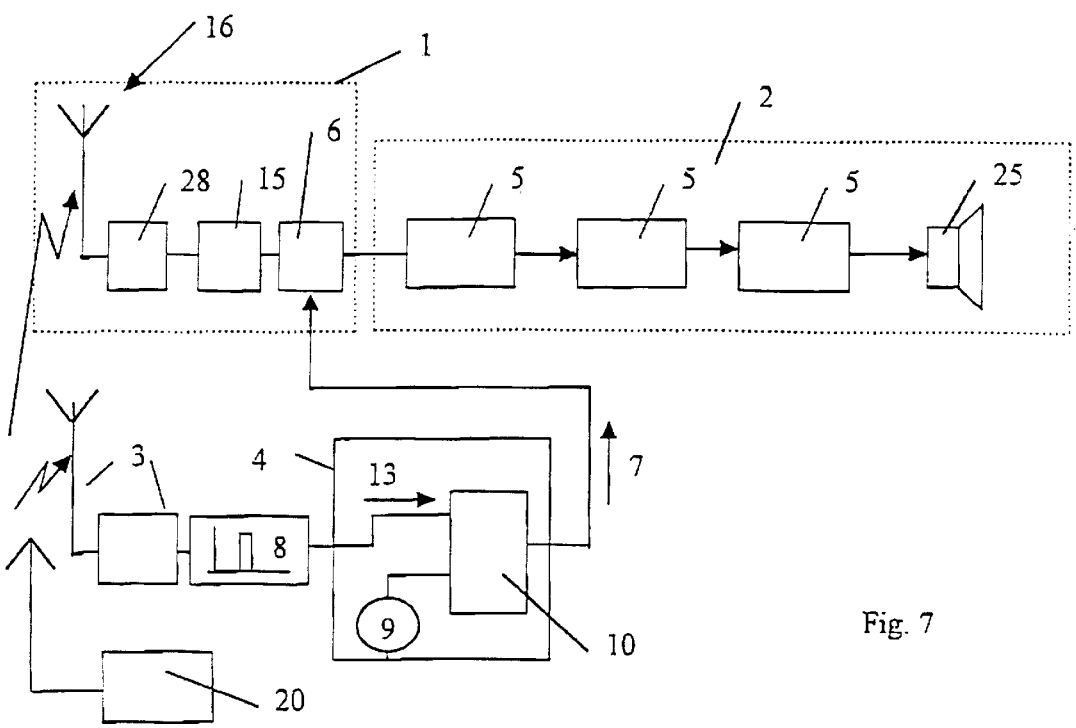
FIG. 7 shows a block diagram of another embodiment of the invention wherein the antenna has an antenna amplifier, and a transit time element with a post connected controllable transmission element.

FIG. 7 shows a receiver system of this type wherein antenna 1 is formed as an active antenna with an antenna amplifier 28. The configuration can thereby be by way of sampling the interior amplification of the active antenna with the aid of controllable transmission element 6. Because of the limitation of the band to band width 22 of band pass filter 8, there must be a corresponding transit time element 15, in the signal train of the active antenna.

Figure 8:
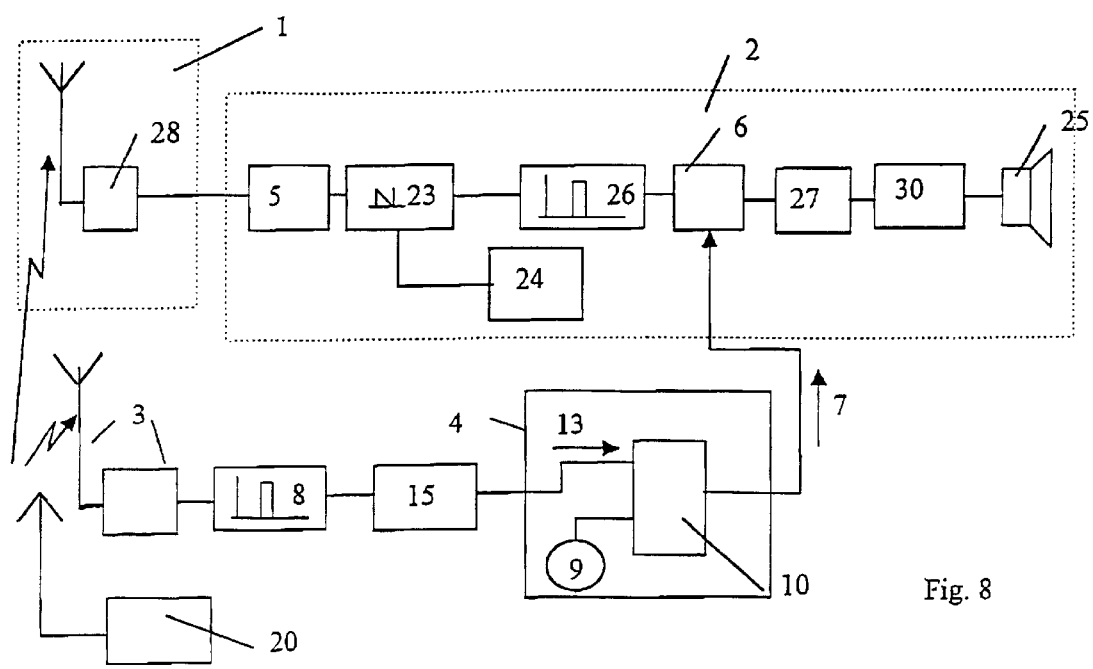
FIG. 8 shows a block diagram of a receiver having a controllable transmission element and an interference signal receiving device having a sampling device and a transit time element.
Figure 9:
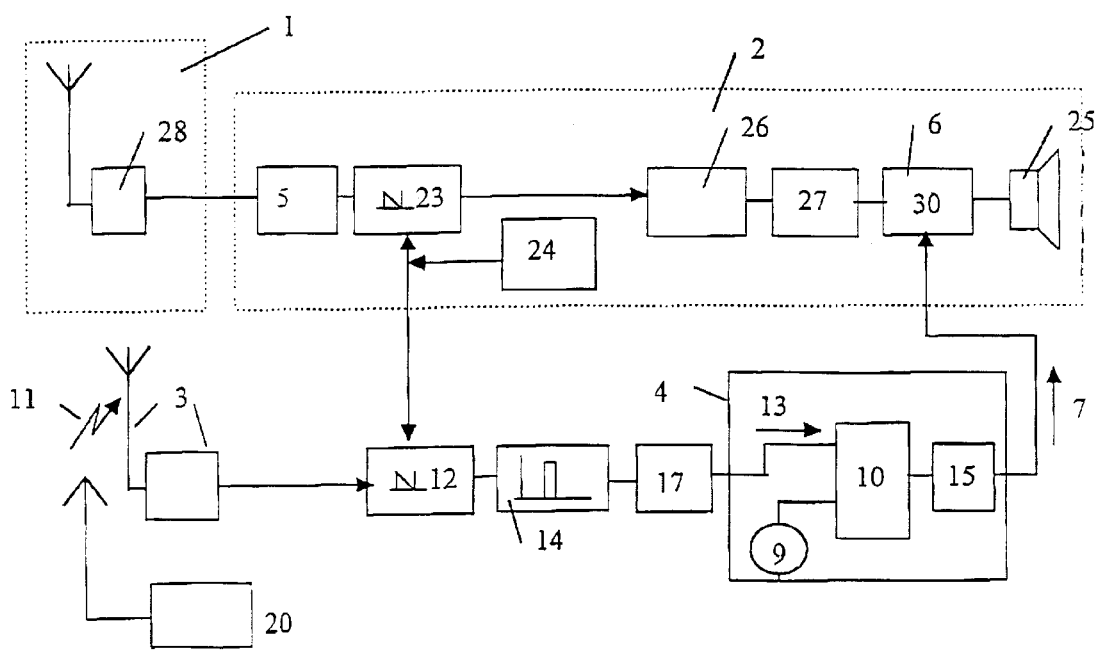
FIG. 9 shows a block diagram of the receiver system having a signal receiving device with a sampling device in the range of a low frequency component of the receiver.

FIG. 8 shows that the transit time element 15 is included in the signal branch of the interference signal receiving device 29 to improve the congruency of the time wise positioning of the sampling interval with the point of time of appearance in the interface in the receiving usable signal 16. As shown in FIG. 9, transit time element can be placed at the exit of logic circuit 10 to retard the signal whereby the sample signal is retarded by the required time difference.

Figure 10A:
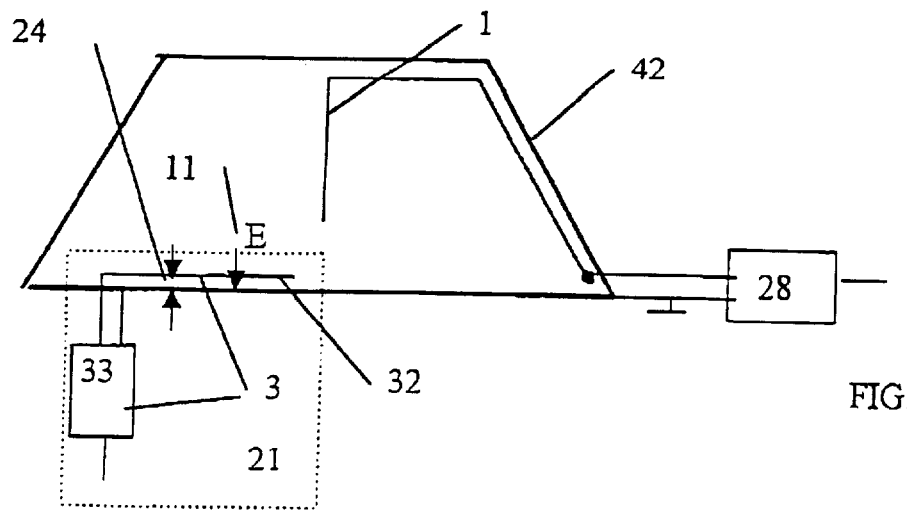
FIG. 10a shows a receiver system having an electrical coupling conductor disposed at a suitable distance.
Figure 10B:
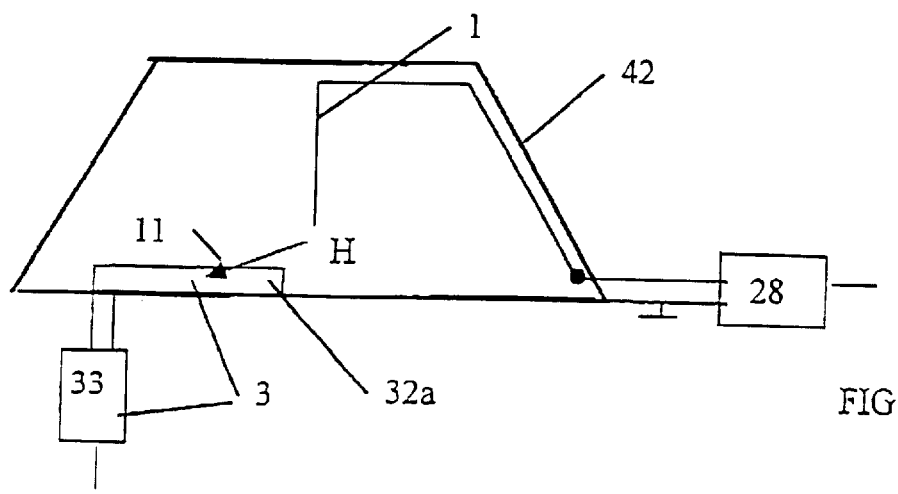
FIG. 10b shows a coupling element that is in the vicinity of the window frame.
Figure 10C:
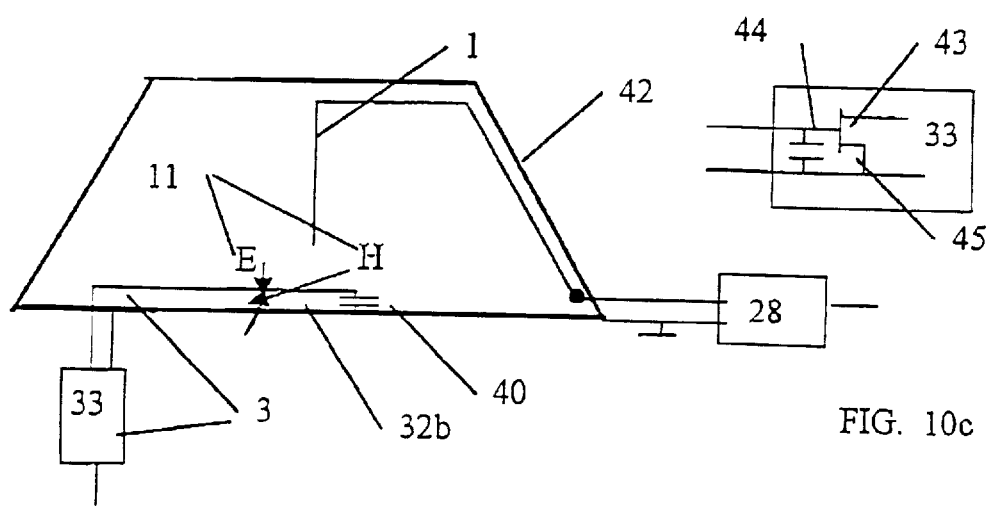
FIG. 10c shows a coupling element showing a series of capacitors and also shows the electrical and magnetic fields associated with these capacitors.

To achieve a rather large ratio of interference radiation level 13 to receiving usable signal 16, coupling element 3 which receives interference radiation 21 should be configured to a coupling conductor 32 and arranged in the vicinity of antenna 1. However, coupling conductor 32 is configured so that its electric-magnetic coupling to the body of vehicle 20 is substantially greater than the unavoidable coupling of antenna 1 to the body of vehicle 20. In addition, the associated coupling of coupling element 3 to the free space is substantially smaller than that of antenna 1. With this design, the intakes of the vehicle bound interference radiation 11 of coupling element 3 and of antenna 1 are similar to one another. In addition, the interferences of the receiving usable signal can be sampled in an aimed manner. Embodiments of coupling element 3 of this type are represented in FIGS. 10a, b, and c. Coupling element 3 is comprised of coupling conductor 32 with a co-coupling circuit 33 respectfully. In FIG. 10a coupling conductor 32 is configured so that it receives interference radiation 11 as electrical field strength E. In FIG. 10b, however, coupling conductor 32 is configured as magnetic loop 32a for receiving interference radiation 11 as magnetic field strength H. In FIG. 10c, there is shown both magnetic loop and electrical loop 32b for receiving interference radiation 11 as both magnetic field strength H and electrical field strength E.

Coupling conductor 32 is arranged in the vicinity of window frame 42 because of the high concentration of the electrical and magnetic fields of interference radiation 11 in an immediate vicinity of window frame 42. The superposed uptake of electrical and magnetic field components of interference radiation 11 is done with the aid of coupling conductor 32. This embodiment is shown in FIG. 10c wherein both ends are subjected to capacitive loading. Electronic element 43 in coupling circuit 33 forms with its input capacity of less than 50 pF between control electrode 44 and the source electrode 45 the capacitive load. The exit tension of electronic elements 43 contains both magnetic and electrical field components of interference radiation 11 effected components.

Figure 11:
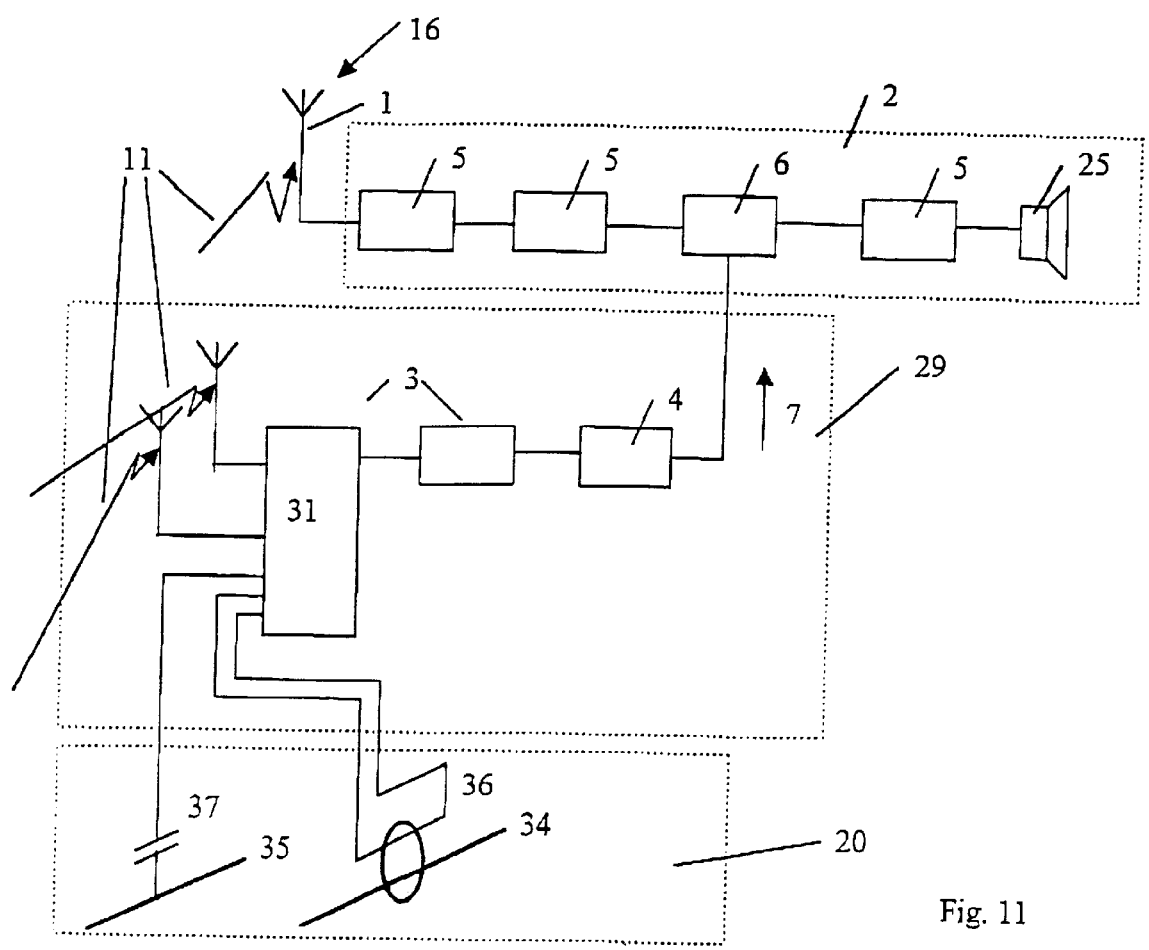
FIG. 11 shows an additional embodiment of the receiver system having a matrix circuit.

FIG. 11 shows a coupling element 3 for co-coupling with immediate inductive coupling at conductor 34 which carries interference current. In a similar manner, coupling element 3 is represented as capacitive coupling at a conductor 35 which carries the interference tension, at the vehicle 20. With the aid of matrix circuit the signals of several coupling elements 3 emanating from different interference sources, are superposed in a linear and weighted manner. Such a matrix circuit can be realized as a resistance network. The exit signal of matrix circuit 31 is passed to evaluation circuit 4, when there is correct weighting of the individual interference causes, the interference components of such causes can be effectively sampled in the receiving usable signal.

In reception situations in which there is a sufficiently large level of the receiving usable signal 16 it is advantageous to not utilize the sampling process because the interference components due to the interference radiation 11 do not take effect as receiver interferences. This will fully preclude remainder interferences, which could be associated with the sampling per se. Received usable signals 16 have an interference region which is between dominant pulse like receipt interferences, with complete sampling and negligible pulse like receipt interferences without sampling, so that the sampling depth is shown as a function of the level.

Figure 12:
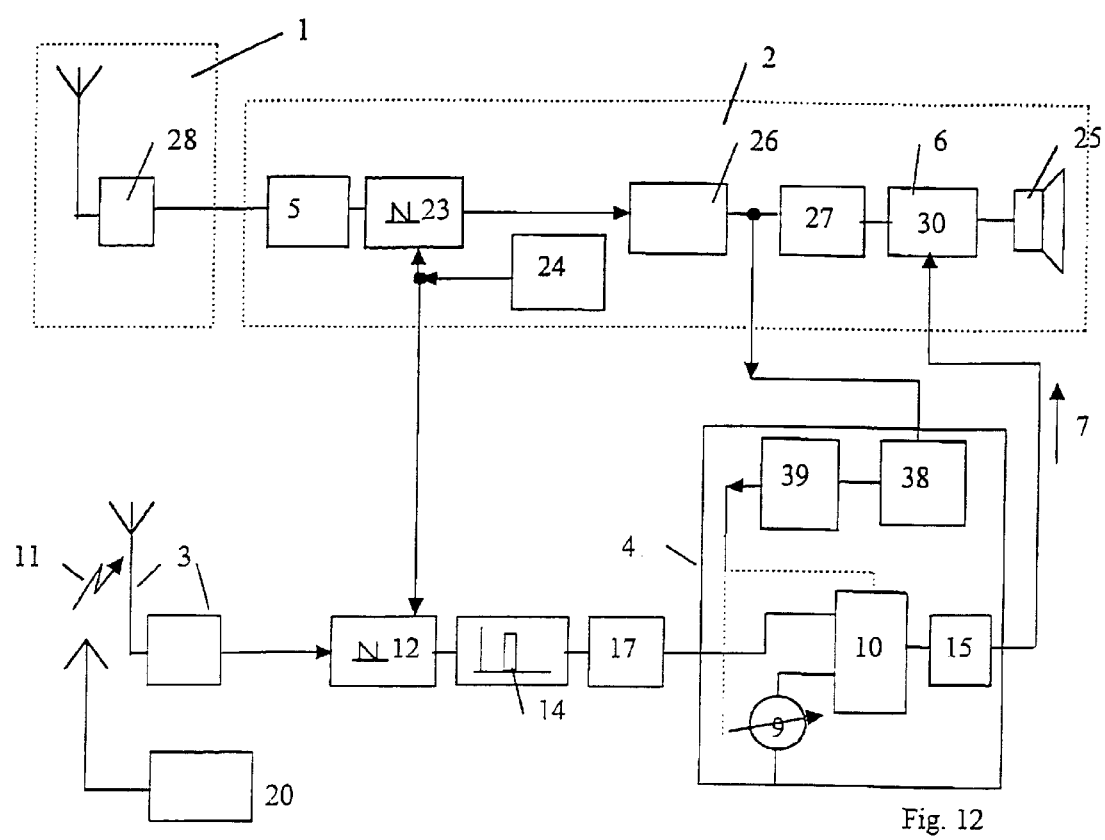
FIG. 12 shows another embodiment of the receiver system having a level indicator and a level evaluation circuit for control of the sampling time and the sampling depth through adjustment of the reference level and the logic circuit.

In FIG. 12, in receiver 2, the signal level is passed to a level indicator 38 and evaluated in a level evaluation circuit 39 with respect to the sampling time and the sampling depth. Through adjusting of reference level 9 and logic circuit 10, a suitable sampling time and suitable sampling depth is adjusted.

In a simplified embodiment, especially exhibiting the least number of components in the logic circuit 10, the ratio of level of receiving usable signal 15 to the interference radiation 13 is determined. When occurring below a threshold value, the controllable transmission element 6, through activation with the aid of sample signal 7, controls a low frequency component so that during the time interval of sampling, the present receiving usable signal is blocked at its output. However, the last value prior to commencement of the sampling is present in a sample and hold situation.

Accordingly, while several embodiments of the present invention have been shown and described, it is to be understood that many changes and modifications may be made thereunto without departing from the spirit and scope of the invention as defined in the appended claims.

What is claimed is:

1. A receiver system for a motor vehicle (20) having an antenna (1) comprising:

a) a receiver (2) for receiving signals from said antenna;
   b) at least one interference signal receiving device (29) connected to said receiver, comprising:
      i) at least one coupling element (3) with an input for taking in pulse-like interference radiation emitted by a vehicle body and which interfere with reception;
      ii) at least one evaluation circuit (4) for presenting an interference radiation (11), and being connected to said at least one coupling element (3);
   c) at least one transmission element (5) disposed within said receiver (2); and
   d) at least one controllable transmission element (6) disposed within said receiver (2) and connected to said at least one transmission element (5), said at least one controllable transmission element (6) being controllable with respect to its transmission behavior for the purpose of signal sampling, wherein a series of output signals are passed to said at least one evaluation circuit (4) so that during the duration of the interference pulses, a series of receiving usable signals (16) are sampled and said at least one coupling element (3) is configured and positioned in the vehicle (20) so that its output signal contains predominantly the pulses of the interference radiation (11) which lead to reception interference, and wherein the ratio of the component of the receiving usable signals over the interference radiation is at least 10 dB lower than the output of the antenna over the interference radiation.

2. The receiver system according to claim 1, wherein said at least one coupling element (3) and said at least one evaluation circuit (4) are in a broad band configuration wherein said at least one evaluation circuit (4) further comprises a reference level (9) and at least one logic circuit (10), wherein when said reference level (9) is exceeded by an interference level (13), said at least one evaluation circuit emits a sample signal (7), and said receiver signal is sampled.

3. The receiver system according to claim 1, wherein said at least one evaluation circuit further comprises a band pass filter (8), being connected to said at least one coupling element (3), wherein said evaluation circuit (4) further comprises a reference level (9) and at least one logic circuit (10), wherein when said reference level (9) is exceeded by a interference radiation level (13), and wherein said evaluation circuit emits a sample signal (7) and said receiver signal is sampled.

4. The receiver system according to claim 3, wherein said at least one band pass filter (8) further comprises a middle frequency (41) adapted to a fixed frequency, wherein said middle frequency (41) has a bandwidth (22) that is selected sufficiently large so that said at least one bandpass filter (8) contains the interference radiation level (13) that is largely representative of the interferences in a receiving channel of said receiver (2).

5. The receiver system according to claim 4, wherein said bandwidth (22) of said middle frequency (41) within said bandpass filter (8) is approximately congruent with said receiver's adjustable frequency range.

6. The receiver system according to claim 5, wherein a pass-through range of said at least one band pass filter (8) is approximately congruent with a receiver channel within said receiver (2).

7. The receiver system according to claim 6, wherein said receiver (2) comprises an overlay receiver having a receiver mixer (23), an oscillator (24), a receiver ZF component (26), a receiver demodulator (27), and a terminus device (25) being adjusted for control of the pass-through range of said band pass filter (8) with respect to the present receiver channel connecting said receiver (2) to said coupling element (3) wherein said receiver system further comprises a receiver circuit (18) being post connected to said coupling element (3), and comprising a mixer (12), an intermediary frequency filter (14) and a demodulation circuit (17), wherein an oscillator signal of the receiver is passed to the mixer wherein an interference radiation level (13) is won at the exit of the demodulator circuit (17).

8. The receiver system according to claim 3, further comprising at least one transit time element (15) disposed within said receiver (2) and connected to said at least one transmission element (5), said at least one transit time element (15) balancing transit time differences in the direction of receiver signal flow ahead of said controllable transmission element (6) in the receiver (2) or, in said at least one interference signal receiving device (29), so that the time range of the sampling is largely congruent with the time range of the appearance of the interference in the receiver signal.

9. The receiver system according to claim 1, wherein the antenna (1) is a controllable transmission element (6) which comprises at least one sampling device (19) which is known and passes a sample signal (7).

10. The receiver system according to claim 1, wherein the antenna (1) is an active antenna having an antenna amplifier (28), wherein the sampling is given through sampling the inner amplification of the active antenna (1).

11. The receiver system according to claim 1, wherein said controllable transmission element (6) further comprises at least one sampling device (19) set in a range of the intermediary frequency of said receiver (2) and wherein, said at least one interference signal receiving device (29) having at least one transit time element (15).

12. The receiver system according to claim 11, wherein said at least one transit time element (15) is brought into the exit of said at least one logic circuit (10) and the sample signal (7) wherein the transit time element is retarded by a necessary time difference.

13. The receiver system according to claim 1, wherein said at least one sampling device (19) is present in the range of the base frequency range of said receiver (2).

14. The receiver system according to claim 1, wherein said at least one coupling element (3) is configured as an antenna pertaining to said interference radiation (21) and further comprising at least one coupling conductor (32) disposed adjacent to the antenna (1) wherein said at least one coupling conductor (32) is configured so that its electromagnetic coupling, and its tag receipt of vehicle associated interference radiation (11) is substantially greater than an unavoidable coupling of the antenna (1) to the car body of the vehicle (20) and the associated coupling of at least one coupling element (93) to the free space, and the resultant receipt of said receiving usable signals (16) of the coupling element (3) is at least 10 dB lower than that of the antenna (1).

15. The receiver system according to claim 14, wherein the antenna (1) is configured as a windowpane antenna and said at least one coupling element (3) for receipt of the interference radiation fields has a high density of said interference radiation (11) in the vicinity of the window frame, wherein said antenna (1) and said coupling element (3) are configured as an electrically acting antenna pertaining to interference radiation (21) and as an electrical coupling conductor (32), at an appropriate distance (24) in general parallel to the metallic window frame (42) of the vehicle (20).

16. The receiver system according to claim 14, wherein a distance (24) between said at least one coupling element (3) and said car vehicle is selected so that a maximum level is obtained within said at least one coupling element (3) from said resulting interference radiation level (13), and from the receiving usable signal (16).

17. The receiver system according to claim 16, wherein said at least one coupling element (3) is disposed adjacent to said window frame (20) and configured for superposed receipt of the magnetic and electric interference radiation fields from and receiving a combined electric and magnetic acting antenna pertaining to interference radiation (21) adjacent to metallic window frame (42) of vehicle (20).

18. The receiver system according to claim 17, wherein the antenna pertaining to interference radiation (21) comprises a longitudinally stretched coupling conductor (32) guided in a small distance, parallel to the metallic window frame (42), said frame (42) is combined at one end by a capacitor (40) to an adjacent window frame (42), wherein its other end is connected to a control electrode of a controllable active three pole element (43) having an input capacitance of less than 50 pF wherein a source electrode (45) of said element is connected in high frequency to the adjacent conducting window frame (42), to form a loop, wherein the dimensions and capacity of this loop are selected such that they form an interference radiation (11) resulting in an interference radiation level (13) which is representative of the receiver (2) and interference causing receiver signals.

19. The receiver system according to claim 14, wherein the antenna (1) is configured as a windowpane antenna and said at least one coupling element (3) is configured as a magnetically acting antenna pertaining to interference radiation (21), in the form of a magnetic coupling conductor loop (32a) in the vicinity of the metallic window frame (42) of vehicle (20).

20. The receiver system according to claim 1, wherein said at least one coupling element (3) for co-coupling of interference signals is configured as an immediate inductive coupling at an interference tension carrying electric conductor or as a capacitive coupling to a conductor (35) carrying the interference tension of vehicle (20) or, respectively the coupling element (3) is configured for superposed layered inductive and electrical coupling.

21. The receiver system according to claim 1, wherein said at least one coupling element (3) for co-coupling of interferences are passed to a matrix circuit (31) for weighted superposition from individual interference sources emanating interference radiation (11) and wherein the exit signal (31) is passed to said at least one evaluation circuit (4).

22. The receiver system according to claim 1, wherein said evaluation circuit further comprises a level indicator (38) and wherein a level evaluation circuit (39) is evaluated with respect to the sampling time and the sampling depth and through adjusting of the reference level (9) and the logic circuit (10) which controls a suitable sampling time and a suitable sampling depth.

* * * * *